United States Patent [19]

Goldstein et al.

[11] Patent Number: 5,321,260
[45] Date of Patent: Jun. 14, 1994

[54] EFFUSION METHOD AND AN EFFUSION CELL FOR FORMING MOLECULAR BEAMS

[75] Inventors: Léon Goldstein, Chaville; René Vergnaud, St Vrain; Jean-Pierre Chardon, Thiais, all of France

[73] Assignee: Alcatel Alsthom Compagnie Generale d'Electricite, Paris Cedex, France

[21] Appl. No.: 922,478

[22] Filed: Jul. 31, 1992

[30] Foreign Application Priority Data

Aug. 1, 1991 [FR] France .................................. 91 09812

[51] Int. Cl.$^5$ ............................................. H05H 3/02
[52] U.S. Cl. ................................. 250/251; 250/492.1; 250/492.2
[58] Field of Search ............. 250/251, 492.2 R, 492.1; 148/DIG. 169; 118/726

[56] References Cited

U.S. PATENT DOCUMENTS

| | | | |
|---|---|---|---|
| 3,866,039 | 2/1975 | Geller et al. | 250/251 |
| 4,664,063 | 5/1987 | Ashizawa et al. | 148/DIG. 169 |
| 5,025,751 | 6/1991 | Takatani et al. | 148/DIG. 169 |
| 5,034,604 | 7/1991 | Streetman et al. | 250/251 |
| 5,120,393 | 6/1992 | Kubo et al. | 148/DIG. 169 |
| 5,128,538 | 7/1992 | Genova et al. | 250/251 |

FOREIGN PATENT DOCUMENTS

| | | |
|---|---|---|
| 2572099 | 4/1986 | France . |
| 2598721 | 11/1987 | France . |
| 2080271 | 2/1982 | United Kingdom . |

OTHER PUBLICATIONS

Journal of Vacuum Science and Technology: Part B, vol. 8, No. 2, Mar. 1990, NY. US, pp. 168–171; R. N. Sacks et al.: "Evaluation of a new high capacity, all-tantalum molecular-beam-epitaxy arsenic cracker furnace".

Journal of Vacuum Science and Technolgy: Part B, vol. 6, No. 6, Nov. 1988, NY US, pp. 1667–1670; Mattord et al: "baffle-free refractory dimer arsenic source for molecular-beam epitaxy".

Journal of Vacuum Science and Technology: Part B, vol. 3, No. 3, May 1985, NY, US, pp. 823–829; D. Huet et al: "molecular beam epitaxy of In0.53Ga0.47As and InP on InP bys using cracker cells".

*Primary Examiner*—Jack I. Berman
*Assistant Examiner*—James Beyer
*Attorney, Agent, or Firm*—Sughrue, Mion, Zinn, Macpeak & Seas

[57] ABSTRACT

Primary molecules are formed by sublimation in a sublimation chamber (2), they are then transferred at a transfer flow-rate to a decomposition head (10) at a higher temperature, and they are transformed therein into secondary molecules that are lighter in weight to form molecular beams (16). In accordance with the invention, the transfer flow-rate is adjusted by adjusting an effective vector flow-rate which is the vector flow-rate of a vector gas inserted into the sublimation chamber via a feed tube (26) and sucked out via a suction tube (30). The invention applies, in particular, to making III-V type semiconductor components by molecular beam epitaxy.

8 Claims, 1 Drawing Sheet

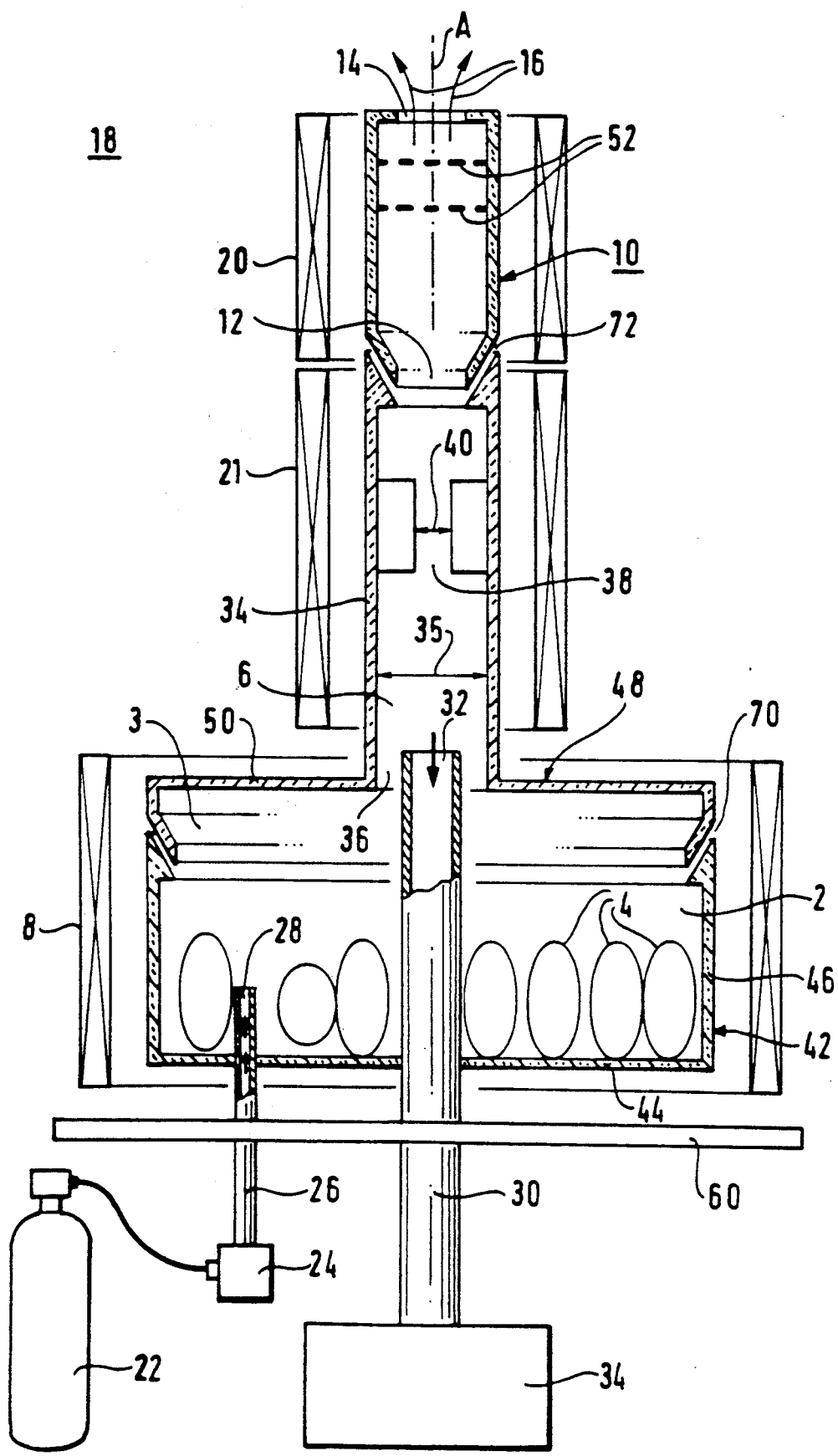

EFFUSION METHOD AND AN EFFUSION CELL FOR FORMING MOLECULAR BEAMS

FIELD OF THE INVENTION

The present invention relates to forming molecular beams, in particular molecular beams of phosphorus and arsenic for epitaxial growth of semiconductor components such as lasers.

BACKGROUND OF THE INVENTION

Widespread use of molecular beam epitaxy for III-V components has led to the development of new effusion cells for arsenic and phosphorus. Such cells make it possible to obtain the fluxes of arsenic and phosphorus that are required for epitaxial growth of materials such as GaAs, GaAlAs, InP, GaP, GaInP, etc.

Over the last few years, the improvements researched by the manufacturers RIBER, VG, and INTEVAC (formerly VARIAN) have had two objectives:

a) Making high-capacity cells enabling arsenic and phosphorus to be used in charges of about 300 grams (g). This improvement makes it possible for the enclosure to be used between two openings thereof for considerably longer periods of time.

b) Developing effusion cells including high-temperature (900° C.) decomposition heads for decomposing $As_4$ and $P_4$ molecules into $As_2$ and $P_2$.

A typical known cell includes two regions heated to different temperatures:

a low-temperature (about 300° C.) sublimation chamber in which solid arsenic or phosphorus is sublimed to form tetramers by means of the following reaction:

$$As_{sol} \mapsto As_4$$

$$P_{sol} \mapsto P_4; \text{ and}$$

a decomposition head in which the following decomposition operation is performed at about 900° C.:

$$As_4 \rightarrow As_2$$

$$P_4 \rightarrow P_2.$$

Using dimer molecules, in particular $P_2$, enables the growth conditions of phosphorus-based materials to be considerably improved by increasing the bonding of the phosphorus. This results in a very significant reduction in phosphorus consumption (by a factor of 10).

Cells currently developed by manufacturers incorporate those two important improvements. But it remains difficult to control the flow-rates of $As_2$ and $P_2$ to within 1% when growing alloys of the GaInAsP type, or to obtain rapid variations in two distinct flow-rates of $As_2$ and $P_2$, such variations being necessary for making certain heterostructures or alloys based on GaInAsP.

Currently, "MOMBE" or "EJMSG" techniques using the gaseous hydrides arsine and phosphine enable the above-described drawbacks to be mitigated. But this requires highly toxic hydrides to be used, and costly precautions must be taken.

An object of the present invention is to provide a simply-made cell making it possible to control the flow-rate of molecular beams rapidly and accurately without using dangerous substances.

SUMMARY OF THE INVENTION

To this end, the invention provides, in particular, an effusion method for forming molecular beams, in which method primary molecules are formed by sublimation in a sublimation chamber, they are then transferred at a transfer flow-rate to a decomposition head at a higher temperature, and they are transformed therein into secondary molecules that are lighter in weight to form molecular beams, the method being characterized by the fact that the transfer flow-rate is controlled by adjusting an effective vector flow-rate which is the vector flow-rate of a vector gas inserted into the sublimation chamber.

More particularly, a description of an embodiment of the present invention is given below by way of non-limiting example and with reference to the accompanying diagrammatic figure. It is to be understood that the component mentioned may be replaced by other components that perform the same technical functions.

BRIEF DESCRIPTION OF THE DRAWING

The single FIGURE is a sectional view through a cell employed in practicing the method constituting a preferred embodiment of the invention.

DESCRIPTION OF THE PREFERRED EMBODIMENT

The overall shape of the cell is circularly-symmetrical about an axis A. The cell is carried by a flange 60 suitable for being inserted in gastight manner into the wall of an epitaxial growth enclosure 18 which is evacuated and maintained under a vacuum.

The functions and the specific features of some of the essential components of the cell are known and are indicated below:

a sublimation chamber 2 having an inside space 3 for containing a charge 4 of a chemical in the solid state, which chemical can form two species of gas molecules, one of which is constituted by primary molecules, and the other of which is constituted by secondary molecules which are lighter in weight than the primary molecules because each secondary molecule contains less atoms of the chemical than each primary molecule and which are to form a molecular beam having the desired mass flow-rate, the chamber having an outlet 6 to enable gas molecules in the chemical to leave the chamber;

sublimation heater means 8 for supplying a sublimation heating power so as to heat the chamber to a sublimation temperature causing said chemical to sublime in the form of said primary molecules with an average mass flow-rate of not less than said desired mass flow-rate, so that the primary molecules leave the chamber at an adjustable mass flow-rate that constitutes a transfer flow-rate;

a hollow decomposition head 10 having an inlet 12 for receiving said primary molecules leaving the sublimation chamber 2, and an outlet 14 for enabling gas molecules to leave the head, towards the enclosure 18; and decomposition heater means 20 for heating the decomposition head 10 to a decomposition temperature which is higher than said sublimation temperature, and which is chosen so as to form said secondary molecules from said primary molecules in the head, so that the secondary molecules leave the chamber by forming said molecular beam 16 with a mass flow-rate substantially equal to said transfer flow-rate.

Typically, said chemical is phosphorus or arsenic, said primary molecules and said secondary molecules being tetramers and dimers respectively, said sublimation temperature and said decomposition temperature respectively lying in the vicinity of 300° C. and 900° C.

In accordance with the present invention, the cell further includes:

a vector gas source 22 for supplying a vector gas suitable for entraining said primary molecules without reacting with the chemical;

flow-rate adjustment means 24 fed by the source for transmitting an adjustable flow-rate to the vector gas, the flow-rate constituting an inlet vector flow-rate;

a vector gas feed pipe 26 having an outlet 28 in said sublimation chamber for inserting the vector gas therein at an inlet vector flow-rate; and a narrow transfer passage 38 between the sublimation chamber 2 and said decomposition head 10 for maintaining a gas pressure that is higher in the chamber than in the head. The vector gas passes through the passage at an effective vector flow-rate constituted on the basis of the inlet vector flow-rate. In accordance with the invention, adjusting the effective vector flow-rate adjusts the transfer flow-rate, and, more particularly, rapid and known variation of the effective vector flow-rate causes rapid and known variation of the transfer flow-rate.

Preferably, the cell further includes:

a suction tube 30 having an inlet 32 in the sublimation chamber; and suction means 34 for sucking out an adjustable flow-rate of the gases present in the chamber via the suction tube, which flow-rate constitutes a suction flow-rate. The effective vector flow-rate is then substantially equal to the difference between the inlet vector flow-rate and the suction flow-rate, and adjusting the suction flow-rate contributes to adjusting said transfer flow-rate. More specifically, such adjustment makes it possible to obtain particularly rapid variations in the transfer flow-rate, and, in particular, sudden zeroing of the transfer flow-rate by means of high flow-rate rapid suction. Such rapid zeroing may be necessary, in particular, when making a sudden transition in the composition of a semiconductor component made by epitaxial growth by using molecular beams. In order to perform the rapid suction, the suction tube has a large flow section and the suction means include a previously-evacuated volume for receiving the sucked gases. Furthermore, the inlet of the suction tube is adjacent to the narrow transfer passage so that the effect of the suction appears firstly at the inlet of the passage.

More precisely, the outlet 6 of the sublimation chamber 2 is equipped with a transfer tube 34 having a flow section 35 larger than four times the flow section 40 of said narrow transfer passage 38. The tube has an inlet 36 which is open to the inside space 3 of the chamber, and an outlet constituted by the narrow transfer passage 38. The inlet of the suction tube 30 is situated in the transfer tube.

Preferably, provision is made for the vector gas to sweep the inside space 3 of the chamber 2, and to be substantially saturated therein by said primary molecules, at least in the vicinity of the outlet 6 of the chamber, i.e. the molecules create a partial pressure in the gas that is substantially equal to the saturation vapor pressure of the molecules in the presence of said charge 4. Such provision concerns the choice of the sublimation heating power, and the positions both of the outlet 38 of the vector gas feed pipe 26 in the sublimation chamber 2, and also of the outlet 6 of the chamber. In the sublimation chamber, primary molecules evaporate from the solid chemical. The primary molecules are later thermally broken in the decomposition head, forming secondary molecules.

Preferably, the cell comprises three portions removably interconnected in series, namely:

a base portion 42 constituting at least the bottom 44 and the sidewall 46 of the sublimation chamber;

an intermediate portion 48 at least partially constituting the cover 50 of the sublimation chamber and the transfer tube 34; and an end portion 10 constituting at least the decomposition head. Said narrow transfer passage is then formed by at least one portion chosen from the intermediate portion 48 and the end portion 10, namely, in the example described, by the transfer tube which is part of the intermediate portion.

The base portion 42 and the intermediate portion 48 are made of quartz. The end portion 10 is made of boron nitride and has internal baffles 52 for thermalizing the primary molecules and the secondary molecules. Conventional-type joints 70 and 72 enable the portions to be connected together with a sufficient degree of gastightness.

More particularly, the sublimation chamber 2 consists of a cylindrical quartz tank typically having a capacity of 300 g of As or P. Two glass-metal transitions on the two tubes 26 and 30 enable the cell to be fixed on the ultrahigh-vacuum flange 60. The vector gas can be inserted by using a mass flow meter accurate to 0.5%.

Controlling the suction means 34 enables the pressure of the gas mixture in the sublimation chamber to be regulated via the central suction tube 30 with accuracy of the order of 0.2%. Rapid variations in pressure in the chamber 2 make it possible to provide the composition transitions required for epitaxial growth.

A "low-temperature" oven constitutes the sublimation heater means 8. It is fixed to the ultrahigh-vacuum flange 60.

The transfer tube 34 is fixed to the base portion 42 via a joint 70. Since the resulting assembly is situated in the enclosure 18 under ultrahigh vacuum, it is not necessary to achieve perfect gastightness at the joint. The tube is equipped with a capillary-type portion which constitutes said narrow transfer passage 38 and maintains a large pressure difference between the sublimation chamber and the decomposition head. From the chamber to the head, the pressure typically goes from 1,330 Pa to 1.33 Pa or $1.33 \times 10^{-2}$ Pa.

The transfer tube is heated to a temperature of the order of 400° C. by means of an oven having two regions 21 and 20 surrounding the tube and the decomposition head 10. The oven is fixed to a "permanent" ultrahigh-vacuum flange (not shown).

The decomposition head 10 is constituted by an assembly made of boron nitride equipped with baffles 52. The head is heated to 900° C. so as to provide conversion from $As_4 \rightarrow 2As_2$ or from $P_4 \rightarrow 2P_2$.

The design of the baffles must enable correct thermalization of the gas, and low head loss of the mixture.

The present invention enables the following advantages to be obtained:

the $As_2$ and $P_2$ flow-rates can be controlled to within 1%;

rapid variations in the flow-rates can be obtained; and toxic hydride gases such as arsine and phosphine can be eliminated.

Such elimination is particularly important because safety precautions can be considerably reduced or even omitted. This enables users to perform experiments similar to those requiring hydride gases on sites where such gases are forbidden. In the same way, investment in safety devices is reduced or even eliminated.

Moreover, implementing such a cell simplifies installations since the hydride regulation and storage modules are eliminated.

We claim:

1. An effusion method for forming molecular beams, in which method primary molecules are formed by sublimation in a sublimation chamber (2), said primary molecules are then transferred at a transfer flow-rate to a decomposition head (10) at a higher temperature, and they are transformed therein into secondary molecules that are lighter in weight because each secondary molecule contains less atoms of said chemical than each primary molecule to form molecular beams (16), the method being characterized by the fact that the transfer flow-rate is adjusted by adjusting an overall vector flow-rate which is the vector flow-rate of a vector gas inserted into the sublimation chamber.

2. An effusion cell for forming molecular beams, the cell including:

a sublimation chamber (2) having an inside space (3) for containing a charge (4) of a chemical in the solid state, capable of forming two species of gas molecules, one of which is constituted by primary molecules, and the other of which is constituted by secondary molecules which are lighter in weight than the primary molecules because each secondary molecule contains less atoms of said chemical than each primary molecule and which are to form a molecular beam having the desired mass flow-rate, the chamber having an outlet (6) to enable gas molecules in the chemical to leave the chamber;

sublimation heater means (8) for supplying a sublimation heating power so as to heat the chamber to a sublimation temperature causing said chemical to sublime in the form of said primary molecules with an average mass flow-rate of not less than said desired mass flow-rate, so that the primary molecules leave the chamber at an adjustable mass flow-rate that constitutes a transfer flow-rate;

a hollow decomposition head (10) having an inlet (12) for receiving said primary molecules leaving the sublimation chamber (2), and an outlet for enabling gas molecules to leave the head, towards an evacuated enclosure (18); and decomposition heater means (20) for heating the decomposition head (10) to a decomposition temperature which is higher than aid sublimation temperature to thereby form said secondary molecules from said primary molecules in the head, so that the secondary molecules leave the chamber by forming said molecule beam (16) with a mass flow-rate substantially equal to said transfer flow-rate;

the cell being characterized by the fact that it further includes:

a vector gas source (22) for supplying a vector gas suitable for entraining said primary molecules without reacting with the chemical;

a vector gas feed pipe (26) having an outlet (28) in said sublimation chamber (2) for inserting the vector gas therein at an inlet vector flow-rate; and a narrow transfer passage (38) between the sublimation chamber (2) and said decomposition head (10) for maintaining a gas pressure that is higher in the chamber than in the head;

so that an effective vector flow-rate of said vector gas is constituted on the basis of the inlet vector flow-rate and passes through the transfer passage, and so that adjusting the effective vector flow-rate adjusts said transfer flow-rate.

3. A cell according to claim 2, characterized by the fact that it further includes:

a suction tube (30) having an inlet (32) in the sublimation chamber (2); and suction means (34) for sucking out an adjustable flow-rate of the gases present in the chamber via the suction tube.

4. A cell according to claim 3, characterized by the fact that said outlet (6) of the sublimation chamber (2) is equipped with a transfer tube (34) having a flow section (35) larger than four times the flow section (40) of said narrow transfer passage (38), an inlet (36) which is open to the inside space (3) of the chamber, and an outlet forming the narrow transfer passage (38), said inlet (32) of the suction tube (30) being situated in the transfer tube.

5. A cell according to claim 2, characterized by the fact that firstly the sublimation heating power, and secondly the disposition of the outlet (28) of the vector gas feed pipe (26) in the sublimation chamber (2) and the outlet (6) of the chamber are such that the vector gas sweeps the inside space (3) of the chamber, and is substantially saturated therein by said primary molecules, at least in the vicinity of the outlet (6) of the chamber.

6. A cell according to claim 4, characterized by the fact that it comprises three portions removably interconnected in series, namely:

a base portion (42) constituting at least the bottom (44) and the sidewall (46) of the sublimation chamber (2);

an intermediate portion (48) at least partially constituting the cover (50) of the sublimation chamber and the transfer tube (34); and an end portion (10) constituting at least the decomposition head;

said narrow transfer passage (38) being formed by at least one portion chosen from the intermediate portion (48) and the end portion (10).

7. A cell according to claim 6, in which said base portion (42) and said intermediate portion (48) are made of quartz, and the end portion (10) is made of boron nitride and has internal baffles (52) for thermalizing said primary molecules and said secondary molecules.

8. A cell according to claim 2, in which said chemical is phosphorus (P) or arsenic (As), said primary molecules and said secondary molecules being tetramers ($P_4$, $As_4$) and dimers ($P_2$, $As_2$) respectively, said vector gas being hydrogen ($H_2$), argon (Ar) or nitrogen ($N_2$), said sublimation temperature and said decomposition temperature respectively lying in the vicinity of 300° C. and 900° C., and said evacuated enclosure (18) being an epitaxial growth chamber.

* * * * *